United States Patent [19]

Gysel et al.

[11] 4,032,849
[45] June 28, 1977

[54] PLANAR BALANCED MIXER/CONVERTER FOR BROADBAND APPLICATIONS

[75] Inventors: Ulrich H. Gysel, Mountain View; Ashok K. Gorwara, San Jose, both of Calif.

[73] Assignee: The United States of America as represented by the Secretary of the Navy, Washington, D.C.

[22] Filed: Sept. 1, 1976

[21] Appl. No.: 719,884

[52] U.S. Cl. .............................................. 325/446;
[51] Int. Cl.² .......................................... H04B 1/26
[58] Field of Search .......... 325/442, 446, 449, 445; 321/69 W; 333/11, 6

[56] References Cited

UNITED STATES PATENTS

| 3,584,306 | 6/1971 | Spacek | 325/446 |
|---|---|---|---|
| 3,678,395 | 7/1972 | Hunton et al. | 325/446 |
| 3,854,083 | 12/1974 | Hulderman et al. | 325/446 |
| 3,939,430 | 12/1976 | Dickens et al. | 325/446 |
| 4,000,469 | 12/1976 | McMaster | 325/445 |

Primary Examiner—John C. Martin
Assistant Examiner—Jin F. Ng
Attorney, Agent, or Firm—R. S. Sciascia; G. J. Rubens; H. Fendelman

[57] ABSTRACT

A broadband millimeter wave (26.5–40 GHz) mixer/converter utilizing slotline and coplanar strip-line for the construction of the hybrid junction. The RF and local oscillator signals are applied 180° out of phase to a pair of beam-lead diodes. A diplexer consisting of a low-pass filter and a bandpass filter is also provided to separate the IF and LO signals. A first microwave integrated circuit (MIC) card carries the waveguide to slotline transition, the slotline transmission section, the tapered coplanar waveguide section and the LO bandpass filter. A pair of Schottky-barrier diodes are connected across the transmission channels of the coplanar waveguide section to form the hybrid junction. The LO input is applied to a section of suspended strip-line on this first MIC card. A second MIC card carries the IF low-pass filter and couples to the IF output of the mixer.

8 Claims, 11 Drawing Figures

PLANAR BALANCED MIXER/CONVERTER FOR BROADBAND APPLICATIONS

BACKGROUND OF THE INVENTION

This invention relates to planar balanced circuits and more particularly to a single balanced broadband millimeter-wave mixer covering frequency ranges up to full waveguide bands. Standard waveguide techniques are not suitable to satisfy the need for broadband millimeter-wave mixers covering frequency ranges in these bands. Particularly, balanced mixers, which are desirable in most systems applications, have limited bandwidth if short-slot or magic-Tee hybrids are employed. In addition, conventional waveguide structures are physically large and often costly to produce. Until recently, two major obstacles limited the bandwidths of waveguide mixers. For many years, chip diodes mounted in a so-called Sharpless waveguide wafer were the only diodes suitable for millimeter-wave frequencies. These diodes were limited in bandwidth because of the parasitic reactances of the chip itself and those of the wafer mount. More recently, GaAs Schottky barrier diodes with very high cutoff frequencies (1,000 GHz and higher) and low junction capacitances have become available. Even more important, GaAs diodes are now on the market in the form of beam-lead devices which make microwave integrated circuits (MIC) at millimeter-wave frequencies practical. Because the MIC transmission-line geometries such as microstrip or strip-line are smaller than waveguide geometries, and the electromagnetic fields are confined to smaller areas, interconnections with small semiconductor diodes are now possible with greatly reduced parasitic reactances.

For wide band applications, single ended mixers are normally insufficient because they lack local-oscillator (LO) noise suppression and low spurious response density. Therefore, balanced or double balanced mixers have to be used. Balanced mixers require either a 90° or 180° hybrid to combine the LO signal and RF signal. Waveguide hybrids are not practical for wide band applications because of their limited bandwidth as in the short-slot coupler, the branch-line coupler and the magic-Tee and because of excessive coupling imbalances as in the multi-hole coupler. In addition, all waveguide couplers to date are quite large in size and require two separate transitions to a circuit medium convenient to mount the two diodes. On the other hand, strip-line or microstrip wideband quadrature hybrids from 26.5 to 40 GHz are very difficult to realize. Branch-line couplers covering the complete Ka-band are feasible but their performance is not very appealing.

It is important at this point to note the differences between a mixer using a 90° hybrid and one using a 180° hybrid. The 90° hybrid generally has good LO and RF port VSWRs but suffers from a low LO-to-RF isolation. Opposed to that, a 180° hybrid-coupled mixer has good LO-to-RF isolation but has normally poor LO and RF port VSWRs.

SUMMARY OF THE INVENTION

The present invention thus relates to a MIC balanced mixer that covers the full waveguide band from 26.5 to 40 GHz (Ka-band). A 180° hybrid junction is formed by joining a balanced slot-line and an unbalanced coplanar waveguide. This invention is believed to be the first planar realization that covers the full 26.5 to 40 GHz waveguide band with performance characteristics comparable to narrow band mixers. Two diodes appearing in series and with equal polarity across the RF port and in parallel with opposite polarity across the LO port complete the hybrid junction. With the diodes so connected, the IF signal appears on the unbalanced side. A diplexer consisting of a low-pass filter and a bandpass filter separate the IF and LO signals. By nature of the geometrical symmetry of the junction, this hybrid has perfect isolation between the RF and the LO ports. The low junction capacitance of the GaAs beam lead Schottky-barrier diodes and the printed circuit approach of the present invention permits mounting of the diodes with minimum additional parasitic reactances and enables wide band matching to the RF and LO ports. Thus, in accordance with the present invention, the advantages of MIC techniques such as reproducibility, high reliability, and low-cost are fully exploited in the construction of a wide band millimeter wave mixer.

STATEMENT OF THE OBJECTS OF THE INVENTION

It is the primary object of the present invention to disclose a MIC balanced mixer that covers the full waveguide band from 26.5 to 40 GHz.

Another object of the present invention is the provision of a broadband microwave mixer suitable for low-cost manufacturing techniques.

Other objects, advantages and novel features of the invention will become apparent from the following detailed description of the invention when considered in conjunction with the accompanying drawings.

BRIEF DESCRIPTION OF THE DRAWINGS

FIG. 3 is a cross-section taken along line V—V of FIG. 2a.

DESCRIPTION OF THE PREFERRED EMBODIMENT

Figure 1:
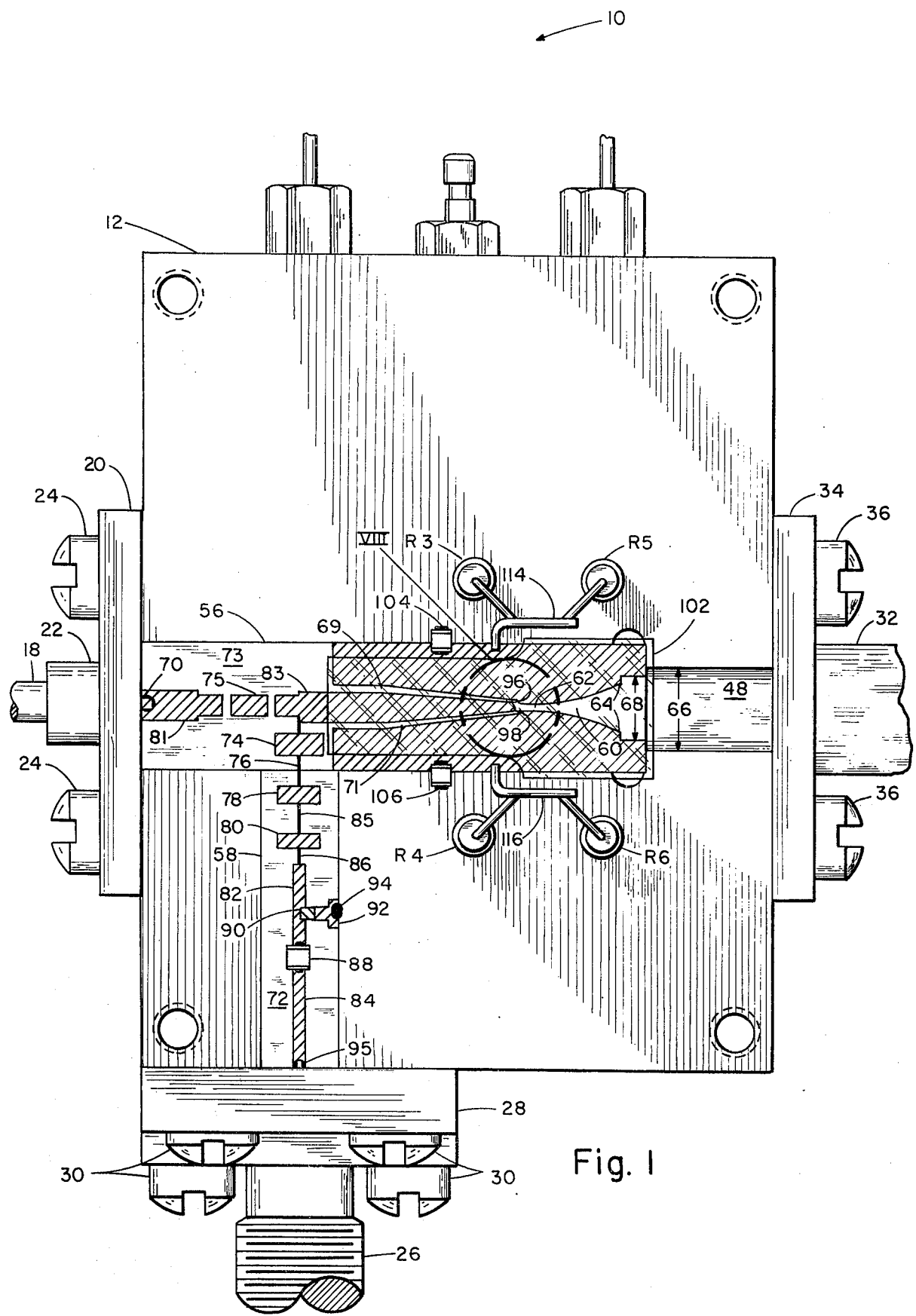
FIG. 1 is a front view of the mixer of the present invention with the cover removed showing the interior assembly.
Figure 2A:
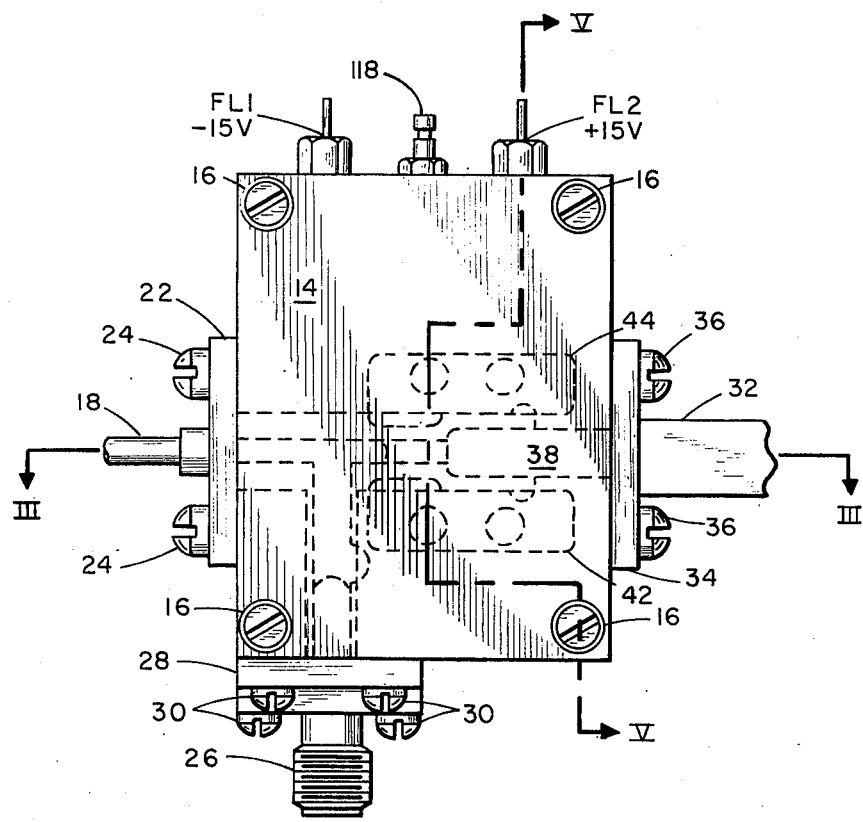
FIG. 2a is a front view of the mixer housing of the present invention showing in dotted lines the cavities formed in the housing.
Figure 2B:
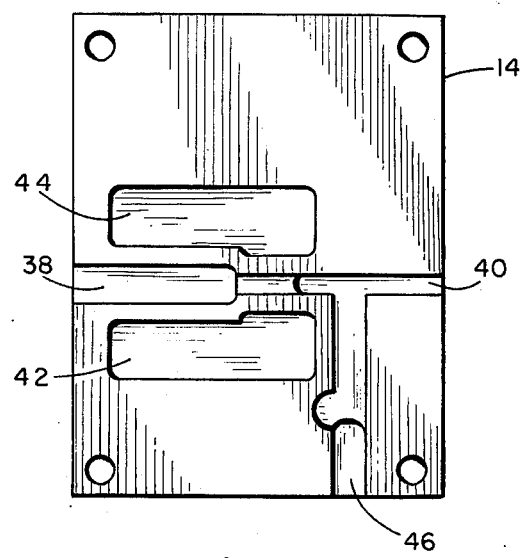
FIG. 2b is a bottom view of the inside of the mixer housing cover removed.
Figure 3:
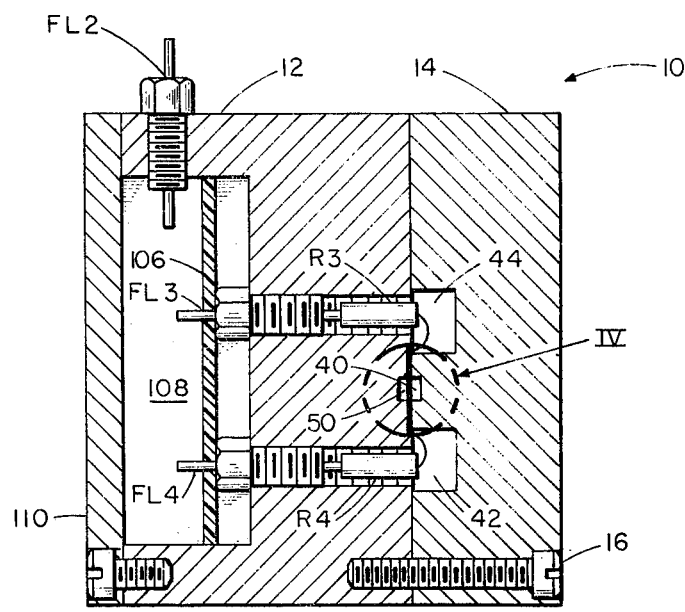
Figure 4:
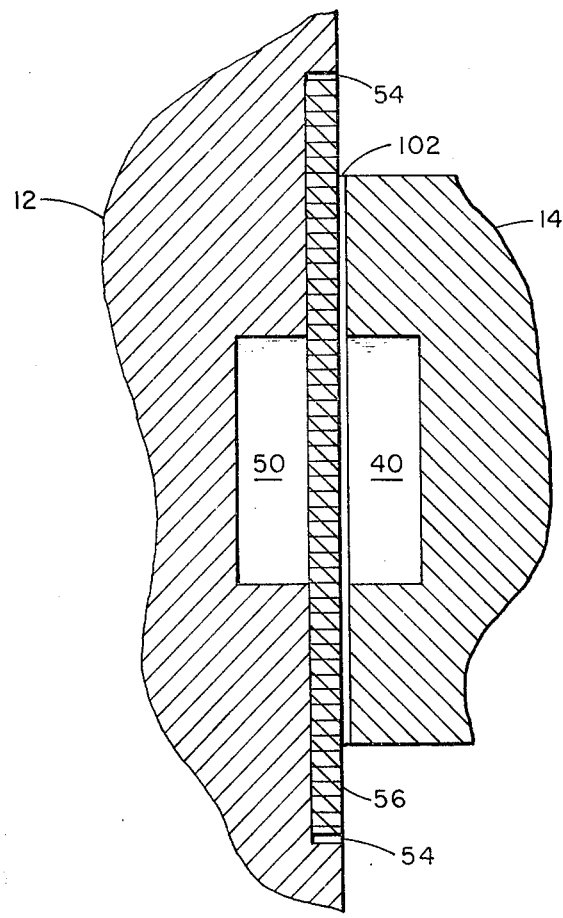
FIG. 4 is a detailed view of the encircled portion of FIG. 3.
Figure 5:
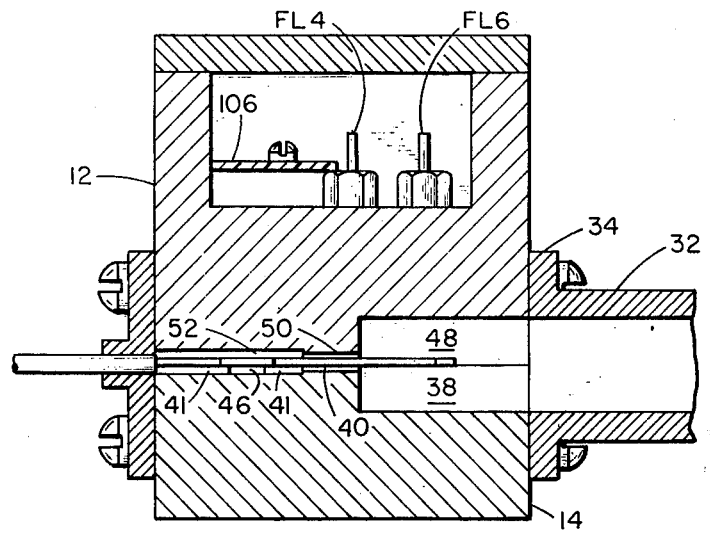
FIG. 5 is a cross-section of the mixer of the present invention taken along lines III—III of FIG. 2 and further illustrating the cavities formed by the housing of the mixer.

Referring now to FIGS. 1, 2a, 2b, 3 and 4 of the drawings, the mixer 10 of the present invention will be described. The housing of the mixer 10 is formed by metallic body section 12 and top cover 14. The top cover 14 is secured to the body 12 by suitable means such as screws 16. The input line for the LO signal is a coaxial semi-rigid cable 18 which is connected to the mixer 10 by flange 20 and coaxial connector 22. The flange is secured to the housing members 12 and 14 by suitable means such as screws 24. Use of a coaxial semi-rigid cable allows easier interconnection with peripheral devices such as a YIG-tuned oscillator which is usually constructed with coaxial transmission lines.

Extraction of the IF signal occurs by means of a coaxial connector 26 secured to the housing members 12 and 14 by flange 28. The flange 28 may be secured to the housing members 12 and 14 by suitable means such as screws 30.

The RF input is similarly applied to the mixer 10 by connecting the waveguide 32 to the mixer housing members 12 and 14 with flange member 34 secured to the housing members by suitable means such as screws 36.

The mixer housing cover plate 14 illustrated in FIGS. 2b, 3, 4 and 5 is provided with a milled channel 38 at the RF end of the mixer. The channel runs across the cover 14 and extends to reduced depth section 40 which extends to slightly increased section 41 at the LO input port for connection to cable 18. The cover 14 is also milled to provide cavities 42 and 44. Cover 14 is additionally milled to provide channel 46 which extends from the IF output port to the channel 40. The mixer body 12 is likewise milled to provide microwave cavity half section 48 (FIGS. 1 and 5) and reduced depth section 50. The dimension of the milled portion of member 12 in the area of the coplanar waveguide taper to be described below is increased slightly as is illustrated at 52 in FIG. 5 which shows the cavities formed by joining the members 12 and 14. Housing body portion 12 is also provided with a recessed area 54 (FIG. 4) for permitting flush mounting of the MIC RF waveguide to slotline transition card to be described below.

Two MIC cards 56 and 58 are positioned (FIG. 1) within the recessed areas in body member 12. It is noted that the recess within which card 58 is positioned is not illustrated for purposes of simplicity. The MIC cards have their circuits printed on suitable substrates such as quartz, fused silica or any other substrate having low loss tangent and low dielectric constant (e.g., $\epsilon_r = 3.78$). The MIC cards 56 and 58 have deposited thereon as by well known sputtering techniques, a metallized layer such as gold.

Referring now to the MIC card 56 illustrated in FIG. 1, it is seen that the card 56 sits in the center of the waveguide, perpendicular to the broad wall. The gold or other suitable metal is removed by well known means to form the circuit thereof to be described. A double cosine tapered transition 60 matches the waveguide input 32 to the slotline section 62 which has a characteristic impedance of, for example, 100 ohms. Only on the waveguide side, the tapered transition 60 is interrupted by a symmetrical single step 64, nominally $\lambda/4$ away from the edge of the substrate. This step 64 compensates the abrupt discontinuity caused by the emergence of the quartz substrate in the waveguide. The height of the waveguide indicated by the double headed arrow 66 is the same as the height of the transition 60 indicated by the double headed arrow 68. The slotline section 62 merges into the tapered coplanar waveguide channels 69 and 71.

Figure 10:
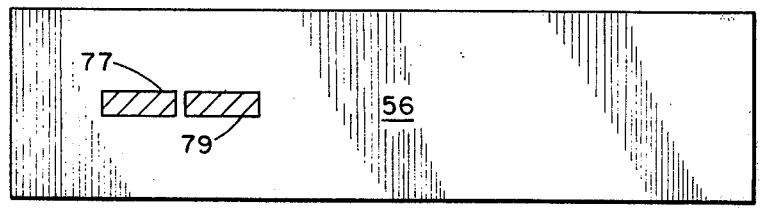
FIG. 10 is a rear view of the MIC card carrying the LO bandpass filter.

A LO bandpass filter 73 is also formed on the MIC card 56 and consists of half-wave parallel-coupled resonators 75, 77 and 79 located alternately on both sides of the suspended substrate (see FIG. 10). The transition to the semi-rigid cable 18 is made in suspended substrate stripline section 81. The center conductor of this suspended stripline is thus seen to be printed on the quartz substrate with the outer conductor formed by the channels 41 and 52 milled in the housing members 12 and 14. It is noted that the three-section bandpass filter 73 is coupled to the coplanar waveguide channels 69 and 71 by a section of straight 50-ohm suspended substrate stripline 83 that tapers into the coplanar waveguide channels 69 and 71. The stripline section 81 is connected to the coaxial cable subassembly 70 as by soldering. The bandpass filter 73 thus passes the LO signal but stops the IF signal.

Extraction of the IF signal occurs by means of a semi-lumped low-pass filter 72 that is constructed in microstrip on the MIC cards 58 and 56. The IF low-pass filter 72 is comprised of conductor sections 74, 76, 78, 80, 85 and 86. Conductor section 74 is connected to conductor section 78 by a gold wire 76. Chip capacitor 88 is soldered to the conductor sections 82 and 84. Also mounted on the card 58 is chip resistor 90 which is connected by metallized region 92 to the solder or silver epoxy ground 94. The other side of the card 58 is metallized (not shown) to complete the microstrip section. The center conductor 95 of connector 26 is coupled to conductive region 84 as by soldering.

Figure 8:
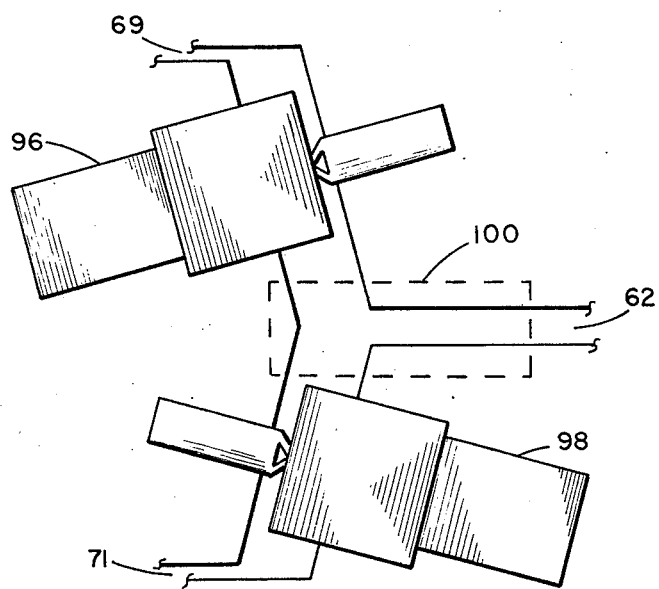
FIG. 8 is a detail drawing of the connection of the beam-lead diodes across the coplanar waveguide channels in the encircled section in FIG. 1.

The most critical elements of the mixer are the diodes 96 and 98 (FIG. 8). They determine to a high degree the RF bandwidth, the conversion loss, and the noise figure that are achievable with a given configuration. The diodes used for the present invention are Schottky-barrier diodes with an extremely high cutoff frequency, $f_c$, low junction capacitance, $C_j$, and low series inductance, $L_s$. Preferably, the beam-lead diodes 96 and 98 are GaAs with $C_j = 0.05$ pF. The low parasitic reactances of the diodes 96 and 98 and the particular design of the mixer of the present invention permits mounting of the diodes with essentially no additional parasitic reactances because matched transmission lines lead directly up to the diode junctions, enabling a wide band match of the mixer diodes at all ports. A small sapphire chip 100 across the slotline section 62 is used as the tuning element. Alternatively, this chip could be replaced by a printed interdigital capacitor. A good match of the diodes is important because mismatch losses at the RF and IF port add directly to the noise figure. Excessive mismatch at the LO port reduces the pump power supplied to the diodes and has a detrimental effect on the noise figure and the dynamic range of the mixer 10.

Separate biasing of the two diodes 96 and 98 is made possible by d.c.-isolating the large, printed gold areas that form the ground conductor for the coplanar waveguide and the slotline taper 62. An RF short to the housing members 12 and 14 of these conductors is accomplished with a 0.0005-inch mylar insulator 102 (FIG. 4) between the gold metallization and the top cover 14 of the mixer. The insulated areas in the top cover are a quarter wavelength wide at mid-band. Together with the cavities 42 and 44 on both sides of the waveguide channel an effective RF choke system is formed. Two chip capacitors 104 and 106 are mounted between the substrate of card 56 and ground as by soldering for the IF ground return.

Figure 6:
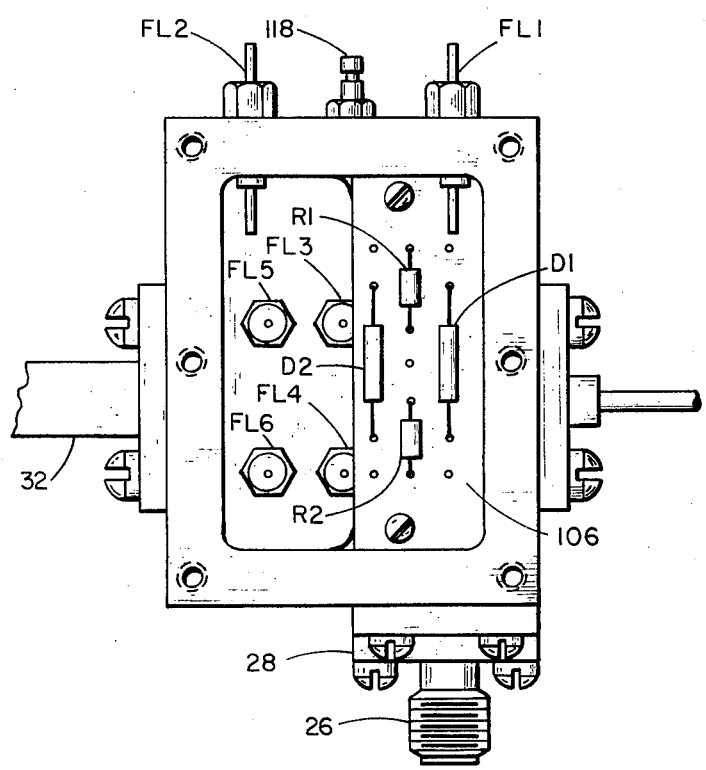
FIG. 6 is a rear view of the interior assembly and the printed circuit card supporting the bias circuit for the beam-lead diodes.
Figure 7:
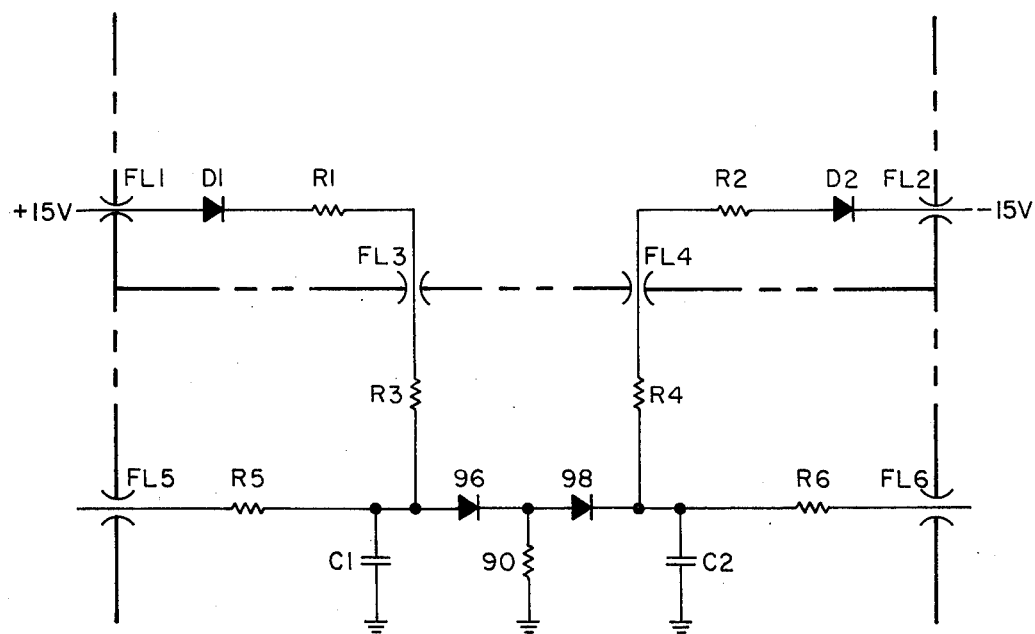
FIG. 7 is a network schematic diagram of the bias circuit for the beam-lead diodes.

Referring now to FIG. 7 there is illustrated a circuit schematic diagram of the current-bias circuit for the diodes 96 and 98. A positive 15-volt supply is connected through feed-through capacitor FL1, diode D1, resistor R1, feed-through capacitor FL3 and resistor R3 which is connected to the annode of beam-lead diode 96. Similarly, a negative 15-volt supply is connected through feed-through capacitor FL2, diode D2, resistor R2, feed-through capacitor FL4 and resistor R4 which is connected to the cathode of beam-lead diode 98 as illustrated. Resistor 90 which may be, for example, a 5.1-kilohm resistor connects the diodes 96 and 98 to ground on the IF output side to provide a path for the difference in the two diode currents to ground. This resistor, however, has a negligible influence on the performance of the mixer 10. Test point feed-through capacitor FL5 and FL6 are connected respectively through test point resistors R5 and R6 as illustrated. The above mentioned feed-through capacitors FL1-FL6 are for radio frequency interference protection. The capacitors C1 and C2 illustrated as connected between the diodes 96 and 98, respectively, and ground represent the capacitances formed by the mylar film 102 and the chip capacitors 104 and 106. Referring to FIG. 6 is is seen that the resistors R1, R2, and the diodes D1 and D2 are mounted on circuit board 106 positioned within the cavity 108 in the housing member 12. Cover plate 110 seals off the cavity. Gold ribbons 114 and 116 (FIG. 1) connect the resistors R3, R4, R5, and R6 to the MIC card 56. Ground pin 118 is also provided on the housing.

Figure 9:
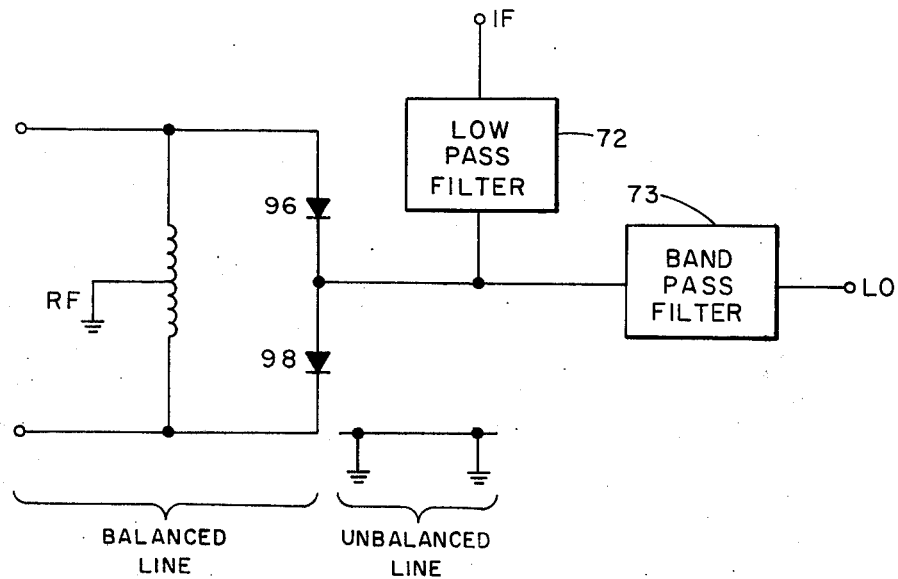
FIG. 9 is a circuit schematic diagram of the mixer of the present invention.

In operation, the waveguide to slotline transition 60 narrows down the broadly distributed field in the waveguide 48 to lower the impedance in order to apply it to the hybrid junction beam-lead diodes 96 and 98. The LO bandpass filter 73 restricts the IF generated at the diodes from going into the LO port. Similarly, the IF low-pass filter 72 prevents the LO signal from the IF port. The invention eliminates the need of going from a waveguide to coaxial and coaxial to slotline transition by going directly from waveguide to slotline, thus eliminating superfluous transitions and permitting broadband as well as high frequency (26.5 to 40 GHz) operation. Referring to FIG. 9 there is illustrated a schematic of the mixer of the present invention which uses balanced and unbalanced lines. The RF input is a balanced-line system. The unbalanced input carries the LO signal. The two diodes, 96 and 98, appearing in series and with equal polarity across the RF port and in parallel with opposite polarity across the LO port complete the hybrid junction. With the diodes so connected, the IF signal appears on the unbalanced side. A diplexer consisting of the low-pass filter 72 and the bandpass filter 73 separates the IF and LO signals. By nature of the geometric symmetry of the junction, this hybrid has perfect isolation between the RF and the LO ports. In practice, the isolation is limited only by the geometrical assymetries and an imbalance of the diodes.

Obviously many modifications and variations of the present invention are possible in the light of the above teachings. It is therefore to be understood that within the scope of the appended claims the invention may be practiced otherwise than as specifically described.

What is claimed is:

1. A millimeter wave single balanced mixer comprising:
   a metallic housing;
   an RF input port formed in said metallic housing comprised of a section of waveguide having first and second broadwalls;
   a first microwave integrated circuit card disposed within said section of waveguide;
   said card including a dielectric substrate having a metallized surface, a waveguide to slotline transition formed on said substrate and having a first end juxtapose to said RF port, a slotline transmission section disposed in said surface operably coupled to said waveguide to slotline transition, a coplanar waveguide section formed in said surface and operably coupled to said slotline section, and bandpass filter means formed in said surface and operably coupled to said coplanar waveguide section and having a terminal for connection to a local oscillator input;
   a second microwave integrated circuit card disposed within said metallic housing comprised of a low-pass filter having a first terminal operably coupled to said bandpass filter means and having a second terminal adapted for providing an IF output;
   said coplanar waveguide section including first and second transmission channels formed in said metallized surface; and
   first and second diodes connected across said first and second transmission channels, respectively, juxtapose to said slotline section.

2. The mixer of claim 1 wherein:
   the plane of said first microwave integrated circuit card is perpendicular to said first and second broadwalls of said waveguide.

3. The mixer of claim 2 wherein said waveguide to slotline transition comprises a tapered transition from said RF port to said slotline section.

4. The mixer of claim 3 wherein said tapered transition is a double cosine tapered transition extending from symmetrical step transitions.

5. The mixer of claim 1 wherein said first and second coplanar waveguide transmission channels are tapered channels.

6. The mixer of claim 1 further comprising a thin sheet of insulator material covering said metallized surface and insulating it from said metallic housing.

7. The mixer of claim 1 wherein said first and second diodes are Schottky-barrier diodes.

8. The mixer of claim 1 wherein said bandpass filter means is a stripline bandpass filter and said low-pass filter is a microstrip filter.

* * * * *